United States Patent
Dan et al.

(10) Patent No.: US 9,620,734 B2
(45) Date of Patent: Apr. 11, 2017

(54) METHODS FOR MAKING OPTICAL COMPONENTS, OPTICAL COMPONENTS, AND PRODUCTS INCLUDING SAME

(71) Applicant: QD VISION, INC., Lexington, MA (US)

(72) Inventors: Budhadipta Dan, Boston, MA (US); Seth Coe-Sullivan, Redondo Beach, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 132 days.

(21) Appl. No.: 14/461,384

(22) Filed: Aug. 16, 2014

(65) Prior Publication Data

US 2015/0048403 A1    Feb. 19, 2015

Related U.S. Application Data

(60) Provisional application No. 61/866,540, filed on Aug. 16, 2013.

(51) Int. Cl.
| | | |
|---|---|---|
| *H01L 33/50* | (2010.01) | |
| *F16J 15/02* | (2006.01) | |
| *H01L 51/52* | (2006.01) | |

(52) U.S. Cl.
CPC ........ *H01L 51/5246* (2013.01); *H01L 33/505* (2013.01); *H01L 2933/0041* (2013.01); *Y10T 428/24851* (2015.01)

(58) Field of Classification Search
None
See application file for complete search history.

(56) References Cited

U.S. PATENT DOCUMENTS

| | | | |
|---|---|---|---|
| 7,498,734 B2 | 3/2009 | Suehiro et al. | |
| 8,375,744 B2 | 2/2013 | Becken et al. | |
| 8,587,000 B2 | 11/2013 | Yamamoto et al. | |
| 8,697,242 B2 | 4/2014 | Kawanami et al. | |
| 9,165,719 B2 | 10/2015 | Logunov et al. | |
| 9,281,132 B2 | 3/2016 | Logunov et al. | |
| 2010/0126898 A1* | 5/2010 | Becken | C03C 27/06 206/524.1 |
| 2010/0200837 A1* | 8/2010 | Zimmerman | H01L 21/02389 257/13 |
| 2010/0237338 A1* | 9/2010 | Yamamoto | H01L 51/5036 257/40 |
| 2011/0135857 A1* | 6/2011 | Logunov | C03C 8/08 428/34.6 |
| 2012/0147538 A1* | 6/2012 | Kawanami | C03C 8/04 361/679.01 |
| 2012/0205032 A1 | 8/2012 | Matsumoto | |
| 2013/0125516 A1 | 5/2013 | Bayne et al. | |

FOREIGN PATENT DOCUMENTS

| | | |
|---|---|---|
| CN | 1574407 | 2/2005 |
| CN | 101215094 | 7/2008 |

(Continued)

*Primary Examiner* — Ashok Patel
(74) *Attorney, Agent, or Firm* — Cantor Colburn LLP

(57) ABSTRACT

Methods for making multiple hermetically sealed optical components are disclosed. Methods for making an individual hermetically sealed optical component are disclosed. An individual hermetically sealed optical component and products including same are also disclosed.

20 Claims, 3 Drawing Sheets

(56) References Cited

FOREIGN PATENT DOCUMENTS

| CN | 101512709 | 8/2009 |
| CN | 101847691 | 9/2010 |
| CN | 102138100 | 7/2011 |
| CN | 102471151 | 5/2012 |
| CN | 102637832 | 8/2012 |

* cited by examiner

METHODS FOR MAKING OPTICAL COMPONENTS, OPTICAL COMPONENTS, AND PRODUCTS INCLUDING SAME

This application claims priority to U.S. Provisional Patent Application No. 61/866,540, filed on 16 Aug. 2013, which is hereby incorporated herein by reference in its entirety for all purposes.

TECHNICAL FIELD OF THE INVENTION

The present invention relates to the technical field of optical components, products including same, and related methods.

BACKGROUND OF THE INVENTION

It would represent an advance in the art to improve optical components including color conversion material for use in remote and proximity lighting and displays. It would represent a further advance in the art to improve the ability to make planar glass hermetic packages that would be suitable for remote and proximity lighting and displays.

SUMMARY OF THE INVENTION

The present invention relates to a method for making optical components, optical components, and products including an optical component.

In accordance with one aspect of the present invention, there is provided a method for making multiple hermetically sealed optical components, the method comprising: providing a first substrate including a surface including a patterned arrangement including two or more discrete regions including an optical material comprising a luminescent material, wherein an hermetic sealing material is disposed on the surface of the substrate located around the perimeter of each of the discrete regions; providing a second substrate over the surface of the first substrate including the patterned arrangement of discrete regions and sealing material thereby forming an assembly; and sealing the sealing material between the first and second substrates to form an assembly of multiple hermetically sealed optical components.

In accordance with another aspect of the present invention, there is provided a method for making multiple hermetically sealed optical components, the method comprising: providing a first substrate including a surface including a patterned arrangement of two or more discrete regions for containing an optical material; including an hermetic sealing material on the surface of the first substrate, the sealing material forming a border around the perimeters of the two or more discrete regions; disposing an optical material over the surface of the first substrate within two or more of the discrete regions, the optical material including a luminescent material; providing a second substrate over the surface of the first substrate including the optical material thereby forming an assembly; and sealing the sealing material between the first and second substrates to form an assembly of multiple hermetically sealed optical components.

In accordance with a further aspect of the present invention, there is provided a method for making multiple hermetically sealed optical components, the method comprising: providing a first substrate; including sealing material on a surface of the substrate configured to define a border around the outer perimeters of two or more discrete regions in a preselected arrangement on the surface; disposing an optical material over the surface of the substrate within two or more of the discrete regions, the optical material including a luminescent material; providing a second substrate over the surface of the first substrate including the optical material thereby forming an assembly; and sealing the sealing material between the first and second substrates to form an assembly of multiple hermetically sealed optical components.

In accordance with a further aspect of the present invention, there is provided a method for making multiple hermetically sealed optical components, the method comprising: providing a first substrate; disposing an optical material over a surface of the substrate in a preselected arrangement including two or more discrete regions, the optical material including a luminescent material; including an hermetic sealing material border around the perimeters of the two or more discrete regions; providing a second substrate over the surface of the first substrate including the optical material thereby forming an assembly; and sealing the sealing material between the first and second substrates to form an assembly of multiple hermetically sealed optical components.

In accordance with a further aspect of the present invention, there is provided an hermetically sealed planar optical component comprising an optical material comprising a luminescent material sealed between planar glass substrates by an hermetic sealing material.

In accordance with a further aspect of the present invention, there is provided an hermetically sealed planar optical component made by a method in accordance with a method described herein.

In accordance with a further aspect of the present invention, there is provided a display including a color conversion component comprising an hermetically sealed planar optical component described herein.

In accordance with a further aspect of the present invention, there is provided a light emitting device including a light emitting component and a color conversion component comprising an hermetically sealed planar optical component described herein.

As used herein, hermetically sealed and hermetic seal refer to a seal where oxygen diffusion through the seal is substantially or completely absent. Preferably the diffusion of oxygen through the seal is no greater than $10^{-8}$ cc/m$^2$/day.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed.

Other embodiments will be apparent to those skilled in the art from consideration of the description and drawings, from the claims, and from practice of the invention disclosed herein.

Figure 1:
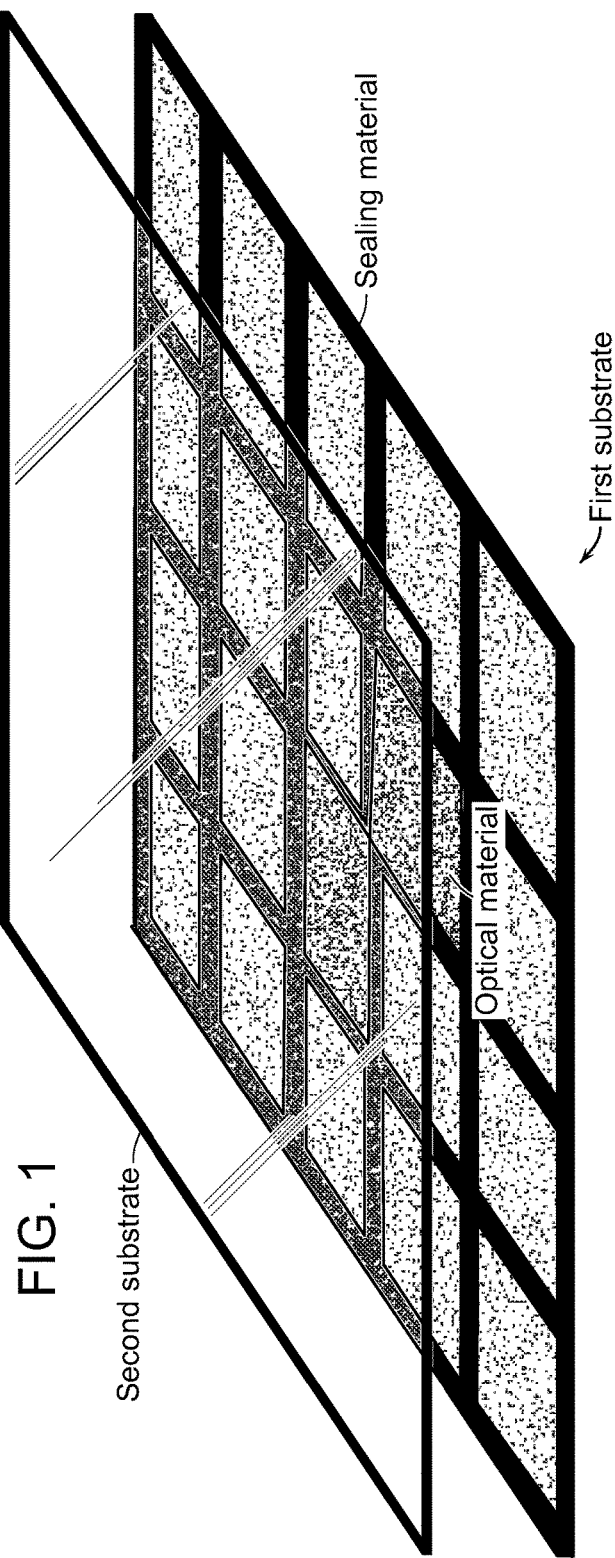
FIG. 1 is a schematic drawing of an exploded view of an example of an assembly in accordance with the invention, prior to sealing, including a first substrate including a surface including a patterned arrangement including two or more discrete regions including an optical material comprising a luminescent material, an hermetic sealing material disposed on the surface of the substrate located around the perimeter of each of the discrete regions, and a second substrate.

The attached figures are simplified representations presented for purposes of illustration only; the actual structures may differ in numerous respects, particularly including the relative scale of the articles depicted and aspects thereof.

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

In one aspect of the present invention, there is provided a method for making multiple hermetically sealed optical components, the method comprising: providing a first substrate including a surface including a patterned arrangement including two or more discrete regions including an optical material comprising a luminescent material, wherein an hermetic sealing material is disposed on the surface of the substrate located around the perimeter of each of the discrete regions; providing a second substrate over the surface of the first substrate including the patterned arrangement of discrete regions and sealing material thereby forming an assembly; and sealing the sealing material between the first and second substrates to form an assembly of multiple hermetically sealed optical components.

In another aspect of the present invention, there is provided a method for making multiple hermetically sealed optical components, the method comprising: providing a first substrate including a surface including a patterned arrangement of two or more discrete regions for containing an optical material; including an hermetic sealing material on the surface of the first substrate, the sealing material forming a border around the perimeters of the two or more discrete regions; disposing an optical material over the surface of the first substrate within two or more of the discrete regions, the optical material including a luminescent material; providing a second substrate over the surface of the first substrate including the optical material thereby forming an assembly; and sealing the sealing material between the first and second substrates to form an assembly of multiple hermetically sealed optical components.

In a further aspect of the present invention, there is provided a method for making multiple hermetically sealed optical components, the method comprising: providing a first substrate; including sealing material on a surface of the substrate configured to define a border around the outer perimeters of two or more discrete regions in a preselected arrangement on the surface; disposing an optical material over the surface of the substrate within two or more of the discrete regions, the optical material including a luminescent material; providing a second substrate over the surface of the first substrate including the optical material thereby forming an assembly; and sealing the sealing material between the first and second substrates to form an assembly of multiple hermetically sealed optical components.

In yet a further aspect of the present invention, there is provided a method for making multiple hermetically sealed optical components, the method comprising: providing a first substrate; disposing an optical material over a surface of the substrate in a preselected arrangement including two or more discrete regions, the optical material including a luminescent material; including an hermetic sealing material border around the perimeters of the two or more discrete regions; providing a second substrate over the surface of the first substrate including the optical material thereby forming an assembly; and sealing the sealing material between the first and second substrates to form an assembly of multiple hermetically sealed optical components.

FIG. 1 depicts a view of an example of a first substrate including a surface including a patterned arrangement including two or more discrete regions including an optical material comprising a luminescent material, wherein an hermetic sealing material is disposed on the surface of the substrate located around the perimeter of each of the discrete regions. For process efficiency, the optical material can be included in each of the discrete regions. Optionally, each discrete region can include the same optical material. Alternatively, one or more different optical materials can be included in various discrete regions.

An hermetic sealing material is disposed on the surface of the substrate located around the perimeter of each of the discrete regions. Preferably, the hermetic sealing material is continuous, without gaps or interruptions, around the perimeter of each discrete region. Hermetic sealing material can be applied to the surface of the substrate by known techniques.

Optionally an area on the surface of the first substrate that is free of hermetic sealing material, or a groove or via in the surface of the surface of the first substrate can be located between the hermetic sealing material around the perimeter of adjacent discrete regions, which can be the lines along which individual hermetically sealed optical components can be separated during the separating step, if performed.

Examples of preferred hermetic sealing materials include, but are not limited to, metal solder or glass frit. Other hermetic sealing materials can also be used. Hermetic sealing materials can be readily identified by the person of ordinary skill in the art.

For example, and without limitation, suitable metals or metal solders useful as sealing materials to provide a hermetic seal and good glass adhesion include indium, indium tin, and indium tin and bismuth alloys, as well as eutectics of tin and bismuth. One exemplary solder includes indium #316 alloy commercially available from McMaster-Carr. Sealing using solders may be accomplished using conventional soldering irons or ultrasonic soldering baths known to those of skill in the art. Ultrasonic methods provide fluxless sealing using indium solder in particular.

Examples of glass frit for forming hermetic seals with glass are known. See, also, for example, US 2011/0135857 of Logunov, et al. for "Method For Sealing A Liquid With A Glass Package And The Resulting Glass Package", published 9 Jun. 2011, US 2013/0125516 of Bayne, et al., for "Hermetically Sealed Glass Package And Method Of Manufacture", published 23 May 2013, which are hereby incorporated herein by reference in their entireties.

Preferably, an hermetic sealing material, e.g., frit, can be sealed at temperature sufficiently low to not have a detrimental effect on the optical material. Preferably, an hermetic sealing material, e.g., frit, has sufficiently low-outgassing so as not have a detrimental effect on the optical material. Preferably, an hermetic sealing material, e.g., frit, has sufficiently low visible light absorption so as to not have detrimentally effect on performance of the optical component for color conversion.

In the example shown in FIG. 1, the sealing material is disposed on the substrate in a grid arrangement, defining multiple discrete regions having a square or rectangular shape on the surface of the substrate. Although depicted as a grid arrangement of similarly sized and shaped discrete regions, the size, shape, and number of discrete regions can be any preselected patterned arrangement of discrete regions. Optionally, the size and shape of discrete regions in a preselected arrangement can be the same or different and/or can be regular or irregular. The size and shape of the discrete regions are typically preselected based on the intended end-use application for the individual hermetically sealed optical component. The number of discrete regions on a substrate can depend on the size of the substrate and the size of the individual optical components.

FIG. 1 also depicts the second substrate being provided over the first substrate prior to sealing.

In the depicted example, the first and second substrates are planar.

The substrates can be constructed from a material that is selected based on the optical transparency of the material to wavelengths of light to pass into and out of the optical component during use in its intended application. The substrate material is also preferably impervious to at least the diffusion of oxygen. A substrate material that is impervious to the diffusion of oxygen and water can also be preferred. Glass is an example of a preferred material for use as a substrate. Other preferred examples include metal oxides, e.g., $Al_2O_3$, indium tin oxide, etc. Willow™ glass (available with thicknesses of 200 microns or less) from Corning can also be used as a substrate. Other materials with adequately low oxygen and water diffusion rates and desired optical transparency can also be used. Identification of such other materials can and be readily ascertained by the skilled artisan.

The first and second substrates can preferably each be constructed from the same material. However, the first and second substrates can be constructed from different materials.

A first substrate can have a flat or unfeatured surface (as shown in FIG. 1) and the sealing material can be used to form two or more discrete regions on the surface of the substrate in a preselected arrangement. The height of the sealing material on the surface of the substrate can further be selected to create borders or dams that define the discrete regions and create wells or dammed areas that can contain the optical material that is included therein. This is particularly advantageous in aspects of the method including an optical material that includes a luminescent material and a liquid component.

Borders or dams of sealing material can be deposited using known techniques.

Optionally, when an hermetic sealing material comprising frit is used with a first substrate comprising glass, the frit can be pre-sintered to the first plate by known techniques, including, for example, heating. This can be useful when the sealing material will be used to form a well for containing an optical material that further includes a liquid component. If desired, pre-sintered frit can be ground to reduce thickness variation of the fit height on the first substrate.

In other aspects, a first substrate can include two or more recesses in the surface that correspond to discrete regions of the preselected arrangement. As discussed above regarding the size and shape of discrete regions, the size and shape of the recessed areas are typically preselected based on the intended end-use application for the individual hermetically sealed optical component. Similarly, the number of recessed areas in the surface of the substrate can depend on the size of the substrate and the size of the individual optical components.

Optical material can be included in the discrete regions by a wide range of known techniques. Optical materials comprising a luminescent material and a liquid or liquid component can be included in discrete regions on the first substrate by a wide range of techniques including thin film coating (e.g., but not limited to, blade coating, rod coating, slot die, spin coating, screen printing, inkjet printing, contact printing, etc). Other examples include, but are not limited to, a fluid dispense system like the ones available from Nordson Assymtek (http://www.nordson.com/en-us/divisions/asymtek/products/fluid-dispensing-systems/pages/fluid-dispensing-systems.aspx).

Optical material can be included in discrete regions that comprise recessed areas in the substrate surface by a method comprising a thin film coating technique. Examples include, without limitation, those listed above.

In another aspect, an optical material can be deposited on a surface of the first substrate (that is free of sealing material) in a preselected arrangement including two or more discrete regions, after which an hermetic sealing material border is created around the perimeters of the two or more discrete regions, after which a second substrate is provided over the surface of the first substrate including the optical material forming an assembly; and the assembly is sealed by sealing the sealing material between the first and second substrates to form an assembly of multiple hermetically sealed optical components. In this aspect, the optical material can preferably further include a liquid component. The optical material can be applied to the first substrate by known techniques. Optical material further including a liquid can be applied by thin film coating techniques, including, but not limited to patch coating, dewetting, screen printing, spin-coating, precision dispensing, inkjet printing, contact printing, or other coating techniques mentioned herein.

For applications in which an optical component is intended for use with a blue light source to create white light, the optical material can include red emitting and green emitting luminescent materials in an appropriate ratio, based on the peak center wavelengths of the blue light source and the red and green emitting materials, to create white light. Determination of such ratio is within the skill of the skilled artisan. This is discussed in more detail below.

After the second substrate is disposed over the surface of the first substrate including the patterned arrangement of discrete regions and sealing material thereby forming an assembly, the method includes the step of sealing the sealing material between the first and second substrates to form an assembly of multiple hermetically sealed optical components.

As discussed above, solder/metal bonding and glass frit are preferred hermetic sealing materials. Such materials are known to form an hermetically sealed bond with glass by fusing them together. Such techniques are known. Examples of sealing temperatures for solder/metal can be in a range from about 120°-200° C. Examples of sealing temperatures for metal solder can be in a range from about 200°-400° C. for glass fit. Sealing temperatures may be outside of these ranges based upon the particular metal solder or frit.

For example, with glass substrates and an hermetic sealing material comprising fit, fusing can be achieved by locally heating the sealing material and glass. For example, using a focused laser can be desirable. Focused laser heating can form the seal without adversely impacting the optical material in neighboring discrete regions.

Examples of other techniques that can be used to form an hermetic seal between the substrates and sealing material include, without limitation, heat, ionic bonding, solder/metal bonding, which techniques are known.

Preferably, the seal that is formed between the substrates and the hermetic sealing material includes no interruptions, cracks, breaks, or other defects that could be detrimental to the hermeticity of the seal.

Preferably, the seal formed between the substrates and the hermetic sealing material possesses sufficient mechanical stability to go through the separation step and subsequent handling and use.

Methods described herein can further comprise separating the assembly of multiple hermetically sealed optical components formed by sealing into individual hermetically sealed optical components. The separating step can comprise scoring, laser-cutting, cutting with a dicing saw, or other techniques. Other known techniques may be identified by the skilled artisan for use in the separating step. Preferably, the sealed assembly is cut at a location between the sealed unseparated individual optical components so as to maintain the hermetic seals of the separated or individual hermetically sealed optical components after separation.

Figure 5:
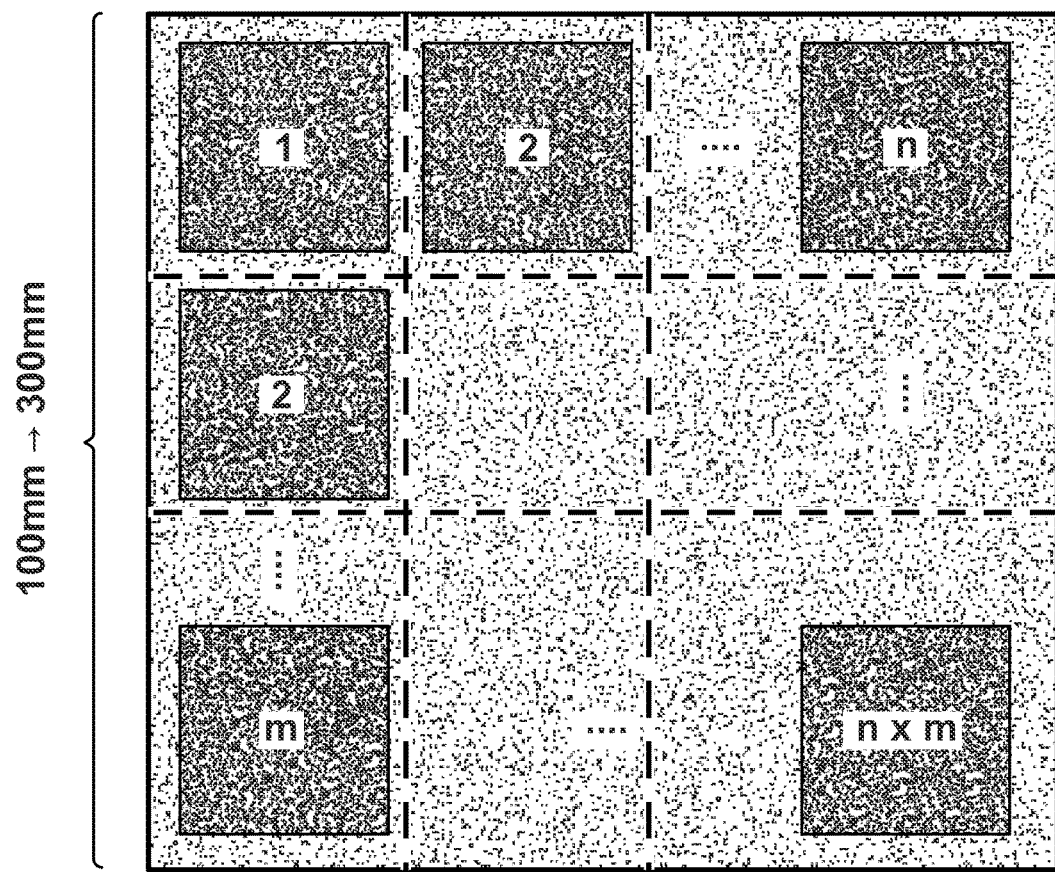
FIG. 5 schematically depicts an example of an assembly in accordance with the invention showing an example of an "n"×"m" array of discrete regions in a preselected arrangement.

FIG. 5 schematically depicts an example of an "n"×"m" array of discrete regions in a preselected arrangement. In the depicted example, a non-limiting exemplary range for at least one dimension of a major surface of the array is from about 100 mm to about 300 mm. A dimension for the length and/or width of a major surface of the assembly within or outside of this range can be useful or desirable.

In an assembly that does not include a gap between the sealing material surrounding the perimeters of adjacent discrete regions, the distance from the perimeter edge of optical material included in one discrete region to the perimeter edge of optical material included in an adjacent discrete region is preferably of sufficient length to permit adjacent hermetically sealed discrete regions including optical material to be separated from each other without interfering with the hermeticity of the seal for the separated components.

In an assembly that includes a gap between the sealing material surrounding the perimeters of adjacent discrete regions, the distance from the perimeter edge of optical material included in a given discrete region to edge of the sealing material farthest from the perimeter edge of the optical material in the given discrete region is preferably of sufficient length to permit adjacent hermetically sealed discrete regions including optical material to be separate without interfering with the hermeticity of the seal for the separated components.

An optical material includes a luminescent material. Preferably, the luminescent material comprises an inorganic photoluminescent material. Examples of inorganic photoluminescent materials include, without limitation, inorganic phosphors and inorganic semiconductor nanocrystals. Preferably the luminescent material comprises inorganic semiconductor nanocrystals.

In certain aspects, an optical material further includes a liquid.

Preferably the optical material comprises a liquid comprising a polymerizable composition in which the luminescent material is dispersed.

According to one aspect, the polymerizable composition is photopolymerizable. The polymerizable composition is preferably substantially free of oxygen and, optionally, substantially free of water. The polymerizable composition is in the form of a fluid.

Preferably, the optical material is included on the first substrate under oxygen-free and, optionally, water-free conditions. Preferably, the other steps of the process through completion of the sealing step are carried out under oxygen free, and optionally water-free conductions.

The polymerizable composition component of the optical material can be cured or solidified by exposure to light of sufficient intensity and with an appropriate wavelength for a period of time sufficient to polymerize the polymerizable composition. The period of time can range between about 10 seconds to about 6 minutes or between about 1 minute to about 6 minutes.

Preferably, the polymerizable composition avoids, resists or inhibits yellowing when in the form of a matrix, such as a polymerized matrix. A matrix in which a luminescent material is dispersed may be referred to as a host material. Host materials include polymeric and non-polymeric materials that are at least partially transparent, and preferably fully transparent, to preselected wavelengths of light.

Examples of polymerizable compositions that can be included in an optical material include, but are not limited to, monomers and oligomers and polymers and mixtures thereof. Exemplary monomers include lauryl methacrylate, norbornyl methacrylate, ebercyl 150 (Cytec), CD590 (Cytec), silicones, thermally cured silicones, inorganic sot-gel materials, such as ZnO, $SnO_1$, $SnO_2$, $ZrO_2$ and the like. Polymerizable materials can be present in an optical material in an amount greater than 50 weight percent. Examples include amounts in a range greater than 50 to about 99.5 weight percent, greater than 50 to about 98 weight percent, greater than 50 to about 95 weight percent, from about 80 to about 99.5 weight percent, from about 90 to about 99.95 weight percent, from about 95 to about 99.95 weight percent. Other amounts outside these examples may also be determined to be useful or desirable.

Exemplary polymerizable compositions can further include one or more of a crosslinking agent, a scattering agent, a rheology modifier, a filler, a photoinitiator, or a thermal initiator.

Suitable crosslinking agents include ethylene glycol dimethacrylate, Ebecyl 150, dodecyldimethacrylate, dodecyldiacrylate and the like. Crosslinking agents can be present in an optical material including a polymerizable composition in an amount between about 0.5 wt % and about 3.0 wt %. Crosslinking agents are generally added, for example in an amount of 1% w/w, to improve stability and strength of a polymer matrix which helps avoid cracking of the matrix due to shrinkage upon curing of the matrix.

Suitable scattering agents include $TiO_2$, alumina, barium sulfate, PTFE, barium titanate and the like. Scattering agents can be present in an optical material including a polymerizable composition in an amount between about 0.05 wt % and about 1.0 wt %. Scattering agents are generally added, for example in a preferred amount of about 0.15% w/w, to promote outcoupling of emitted light.

Suitable rheology modifiers (thixotropes) include fumed silica commercially available from Cabot Corporation such as TS-720 treated fumed silica, treated silica commercially available from Cabot Corporation such as TS720, TS500, TS530, TS610 and hydrophilic silica such as M5 and EHS commercially available from Cabot Corporation. Rheology modifiers can be present in an optical material including a polymerizable composition in an amount between about 0.5% w/w to about 12% w/w. Rheology modifiers or thixotropes act to lower the shrinkage of the matrix resin and help prevent cracking.

Suitable fillers include silica, fumed silica, precipitated silica, glass beads, PMMA beads and the like. Fillers can be present in an optical material including a polymerizable composition in an amount between about 0.01% and about 60%, about 0.01% and about 50%, about 0.01% and about 40%, about 0.01% and about 30%, about 0.01% and about 20% and any value or range in between whether overlapping or not.

Suitable photoinitiators include Irgacure 2022, KTO-46 (Lambert), Esacure 1 (Lambert) and the like. Photoinitiators can be present in an optical material including a polymerizable composition in an amount between about 0.1% w/w to about 5% w/w. Photoinitiators generally help to sensitize the polymerizable composition to UV light for photopolymerization.

Suitable thermal initiators include 2,2'-azobis(2-methylpropionitrile, lauryl peroxide, di-tert butyl peroxide, benzoyl peroxide and the like.

Inorganic semiconductor nanocrystals (which may also be referred to herein as quantum dots) are nanometer sized particles that can have optical properties arising from quantum confinement. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size.

Quantum dots can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

Preferably, a quantum dot comprises a semiconductor nanocrystal. In certain embodiments, a semiconductor nanocrystal has an average particle size in a range from about 1 to about 20 nm, and preferably from about 1 to about 10 nm. However, depending upon the composition, structure, and desired emission wavelength of the quantum dot, the average diameter may be outside of these ranges.

A quantum dot can comprise one or more semiconductor materials.

Examples of semiconductor materials that can be included in a quantum dot (including, e.g., semiconductor nanocrystal) include, but are not limited to, a Group IV element, a Group II-VI compound, a Group II-V compound, a Group III-VI compound, a Group III-V compound, a Group IV-VI compound, a Group compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

In certain embodiments, quantum dots can comprise a core comprising one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

For example, a quantum dot can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as quantum dot cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

A shell can be a semiconductor material having a composition that is the same as or different from the composition of the core. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of quantum dot (e.g., semiconductor nanocrystal) (core)shell materials include, without limitation: red (e.g., (CdSe)CdZnS (core)shell), green (e.g., (CdZnSe)CdZnS (core)shell, etc.), and blue (e.g., (CdS)CdZnS (core)shell.

Quantum dots can have various shapes, including, but not limited to, sphere, rod, disk, other shapes, and mixtures of various shaped particles.

One example of a method of manufacturing a quantum dot (including, for example, but not limited to, a semiconductor nanocrystal) is a colloidal growth process. Resulting quantum dots are members of a population of quantum dots. As a result of the discrete nucleation and controlled growth, the population of quantum dots that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

An example of an overcoating process is described, for example, in U.S. Pat. No. 6,322,901. By adjusting the temperature of the reaction mixture during overcoating and monitoring the absorption spectrum of the core, overcoated materials having high emission quantum efficiencies and narrow size distributions can be obtained.

The narrow size distribution of the quantum dots or semiconductor nanocrystals allows the possibility of light emission in narrow spectral widths. Monodisperse semiconductor nanocrystals have been described in detail in Murray et al. (J. Am. Chem. Soc., 115:8706 (1993) which is hereby incorporated herein by reference in its entirety.

Semiconductor nanocrystals and other types of quantum dots preferably have ligands attached thereto. According to one aspect, quantum dots within the scope of the present invention include green CdSe quantum dots having oleic acid ligands and red CdSe quantum dots having oleic acid ligands. Alternatively, or in addition, octadecylphosphonic acid ("ODPA") ligands may be used instead of oleic acid ligands. The ligands promote solubility of the quantum dots in the polymerizable composition which allows higher loadings without agglomeration which can lead to red shifting.

Ligands can be derived from a coordinating solvent that may be included in the reaction mixture during the growth process.

Ligands can be added to the reaction mixture.

Ligands can be derived from a reagent or precursor included in the reaction mixture for synthesizing the quantum dots.

In certain embodiments, quantum dots can include more than one type of ligand attached to an outer surface.

A quantum dot surface that includes ligands derived from the growth process or otherwise can be modified by repeated exposure to an excess of a competing ligand group (including, e.g., but not limited to, coordinating group) to form an overlayer. For example, a dispersion of the capped quantum dots can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, but not limited to, phosphines, thiols, amines and phosphates.

Examples of additional ligands include fatty acid ligands, long chain fatty acid ligands, alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used.

Suitable coordinating ligands can be purchased commercially or prepared by ordinary synthetic organic techniques.

The emission from a quantum dot capable of emitting light can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as greater than 10%, 20%, 30%, 40%, 50%, 60%, 70%, 80%, or 90%.

The narrow FWHM of quantum dots can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of quantum dots will emit light spanning a narrow range of wavelengths.

Useful quantum dots according to the present invention include those that emit wavelengths characteristic of red light. In certain preferred embodiments, quantum dots capable of emitting red light emit light having a peak center wavelength in a range from about 615 nm to about 635 nm, and any wavelength or range in between whether overlapping or not. For example, the quantum dots can be capable or emitting red light having a peak center wavelength of about 635 nm, about 630 nm, of about 625 nm, of about 620 nm, of about 615 nm.

Useful quantum dots according to the present invention also include those that emit wavelength characteristic of green light. In certain preferred embodiments, quantum dots capable of emitting green light emit light having a peak center wavelength in a range from about 520 nm to about 545 nm, and any wavelength or range in between whether overlapping or not. For example, the quantum dots can be capable or emitting green light having a peak center wavelength of about 520 nm, of about 525 nm, of about 535 nm, of about 540 nm or of about 540 nm.

The narrow emission profile of quantum dots of the present invention allows the tuning of the quantum dots and mixtures of quantum dots to emit saturated colors thereby increasing color gamut and power efficiency beyond that of conventional LED lighting displays. According to one aspect, green quantum dots designed to emit a predominant wavelength of for example, about 523 nm and having an emission profile with a FWHM of about for example, 37 nm are combined, mixed or otherwise used in combination with red quantum dots designed to emit a predominant wavelength of about, for example, 617 nm and having an emission profile with a FWHM of about, for example 32 nm. Such combinations can be stimulated by blue light to create trichromatic white light.

An optical material within the scope of the invention may include a host material, such as can be included in an optical component described herein, which may be present in an amount from about 50 weight percent and about 99.5 weight percent, and any weight percent in between whether overlapping or not. In certain embodiment, a host material may be present in an amount from about 80 to about 99.5 weight percent. Examples of specific useful host materials include, but are not limited to, polymers, oligomers, monomers, resins, binders, glasses, metal oxides, and other nonpolymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include cross-linked polymers and solvent-cast polymers. Examples of other preferred host materials include, but are not limited to, glass or a transparent resin. In particular, a resin such as a non-curable resin, heat-curable resin, or photocurable resin is suitably used from the viewpoint of processability. Specific examples of such a resin, in the form of either an oligomer or a polymer, include, but are not limited to, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like. Other suitable host materials can be identified by persons of ordinary skill in the relevant art.

Host materials can also comprise silicone materials. Suitable host materials comprising silicone materials can be identified by persons of ordinary skill in the relevant art.

In certain embodiments and aspects of the inventions contemplated by this invention, a host material comprises a photocurable resin. A photocurable resin may be a preferred host material in certain embodiments, e.g., in embodiments in which the composition is to be patterned. As a photocurable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments, a host material can comprise a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like can be dissolved in solvents known to those skilled in the art. Upon evaporation of the solvent, the resin forms a solid host material for the semiconductor nanoparticles.

In certain embodiments, acrylate monomers and/or acrylate oligomers which are commercially available from Radcure and Sartomer can be preferred.

Quantum dots can be encapsulated. Nonlimiting examples of encapsulation materials, related methods, and other information that may be useful are described in International Application No. PCT/US2009/01372 of Linton, filed 4 Mar. 2009 entitled "Particles Including Nanoparticles, Uses Thereof, And Methods" and U.S. Patent Application No. 61/240,932 of Nick et al., filed 9 Sep. 2009 entitled "Particles Including Nanoparticles, Uses Thereof, And Methods", each of the foregoing being hereby incorporated herein by reference in its entirety.

The total amount of quantum dots included in an optical material, such as a host material for example a polymer matrix, within the scope of the invention is preferably in a range from about 0.05 weight percent to about 5 weight percent, and more preferably in a range from about 0.1 weight percent to about 5 weight percent and any value or range in between whether overlapping or not. The amount of quantum dots included in an optical material can vary within such range depending upon the application and the form in which the quantum dots are included, which can be chosen based on the particular end application.

In an optical material including a luminescent material comprising an inorganic phosphor (e.g., but not limited to, an chalcogenide phosphor), the weight percent of phosphor in the optical material can be double that described for quantum dots, The ratio of quantum dots used in an optical material is determined by the emission peaks of the quantum dots used. For example, when quantum dots capable of emitting green light having a peak center wavelength in a range from about 514 nm to about 545 nm, and any wavelength in between whether overlapping or not, and quantum dots capable of emitting red light having a peak center wavelength in a range from about 615 nm to about 640 nm, and any wavelength in between whether overlapping or not, are used in an optical material, the ratio of the weight percent green-emitting quantum dots to the weight percent of red-emitting quantum dots can be in a range from about 12:1 to about 1:1, and any ratio in between whether overlapping or not.

The above ratio of weight percent green-emitting quantum dots to weight percent red-emitting quantum dots in an optical material can alternatively be presented as a molar ratio. For example, the above weight percent ratio of green to red quantum dots range can correspond to a green to red quantum dot molar ratio in a range from about 24.75 to 1 to about 5.5 to 1, and any ratio in between whether overlapping or not.

The ratio of the blue to green to red light output intensity in white trichromatic light emitted by a quantum dot containing light emitting device or display including blue-emitting solid state inorganic semiconductor light emitting devices (having blue light with a peak center wavelength in a range from about 450 nm to about 460 nm, and any wavelength in between whether overlapping or not), and an optical material including mixtures of green-emitting quantum dots and red-emitting quantum dots can vary.

Scatterers, also referred to as scattering agents, within the scope of the invention may be present, for example, in an amount of between about 0.01 weight percent and about 1 weight percent. Amounts of scatterers outside such range may also be useful. Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the art. The size and size distribution can be based upon the refractive index mismatch of the scattering particle and the host material in which the light scatterers are to be dispersed, and the preselected wavelength(s) to be scattered according to Rayleigh scattering theory. The surface of the scattering particle may further be treated to improve dispensability and stability in the host material. In one embodiment, the scattering particle comprises $TiO_2$ (R902+ from DuPont) of 0.2 μm particle size, in a concentration in a range from about 0.01 to about 1% by weight.

Examples of thixotropes which may be included in an optical material including quantum dots and a liquid, also referred to as rheology modifiers, include, but are not limited to, fumed metal oxides (e.g., fumed silica which can be surface treated or untreated (such as Cab-O-Sil™ fumed silica products available from Cabot Corporation), fumed metal oxide gels (e.g., a silica gel). An optical material can include an amount of thixotrope in a range from about 0.5 to about 12 weight percent or from about 5 to about 12 weight percent. Other amounts outside the range may also be determined to be useful or desirable.

In certain embodiments, an optical material including quantum dots and a host material can be formed from an ink comprising quantum dots and a liquid vehicle, wherein the liquid vehicle comprises a composition including one or more functional groups that are capable of being cross-linked. The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle.

One particular example of a preferred method of making an ink is as follows. A solution including quantum dots having the desired emission characteristics well dispersed in an organic solvent is combined with the desired resin monomer under nitrogen conditions, until the desired monomer to quantum dot ratio is achieved. This mixture is then vortex mixed under oxygen free conditions until the quantum dots are well dispersed. The final components of the resin are then added to the quantum dot dispersion, and are then sonicated mixed to ensure a fine dispersion. Solvent may then be removed.

An optical component comprising an optical material prepared from such finished ink can be prepared by then depositing the ink to the surface of the first substrate under oxygen free conditions and then UV curing under intense illumination for some number of seconds for a complete cure. According to one aspect, the ink is deposited under oxygen-free and, optionally, water free conditions.

In certain aspects and embodiments of the inventions taught herein, the optic including the cured quantum dot containing ink can be exposed to light flux for a period of time sufficient to increase the photoluminescent efficiency of the optical material.

In certain embodiments, the optical material is exposed to light and heat for a period of time sufficient to increase the photoluminescent efficiency of the optical material.

In preferred certain embodiments, the exposure to light or light and heat is continued for a period of time until the photoluminescent efficiency reaches a substantially constant value.

In aspects including an optical material including a luminescent material dispersed in a photopolymerizable composition, polymerization or curing can be carried out before the sealing step.

In aspects including an optical material including a luminescent material dispersed in a photopolymerizable composition, polymerization or curing can be carried out following the sealing step.

In carrying out the methods of the present invention, the disposing step and sealing step are preferably carried out in the absence of oxygen. Examples of oxygen-free conditions include, for example, a nitrogen or other inert atmosphere.

In carrying out the methods of the present invention, the disposing step and sealing step are optionally carried out in the absence of water.

In carrying out the methods of the present invention, the disposing step and sealing step are preferably carried out in the absence of oxygen and water.

In carrying out the methods of the present invention including an optical material that further includes a liquid, the disposing step, solidifying step, and sealing step are preferably carried out in the absence of oxygen. Examples of oxygen-free conditions include, for example, a nitrogen or other inert atmosphere.

In carrying out the methods of the present invention including an optical material that further includes a liquid, the disposing step, solidifying step, and sealing step are optionally carried out in the absence of water.

In carrying out the methods of the present invention including an optical material that further includes a liquid, the disposing step, solidifying step, and sealing step are preferably carried out in the absence of oxygen and water.

Figure 2:
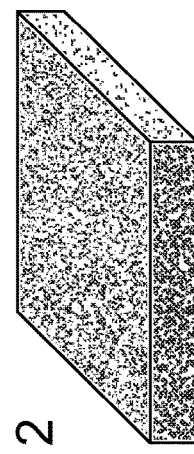
FIG. 2 is a schematic drawing of an example of an individual optical component in accordance with the invention.

FIG. 2 schematically depicts an example of an individual hermetically sealed optical component including a pair of substrates (preferably glass), sidewalls comprising sealed hermetic sealing material (preferably formed from sealed frit or a metal/solder bond) and including an optical material hermetically sealed inside.

Figure 3:
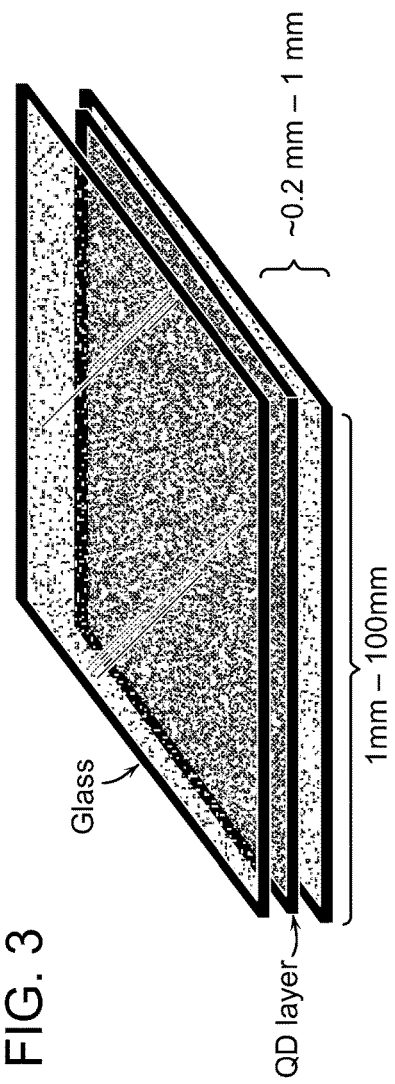
FIG. 3 schematically depicts an example of an exploded view of the substrates (shown as glass) and optical material (shown as a QD (quantum dot) layer) (that are not sealed) components of an embodiment of an individual optical component, showing an example of a dimension of the substrates and thickness of an individual optical component in accordance with the invention (sealing material is not shown).
Figure 4:
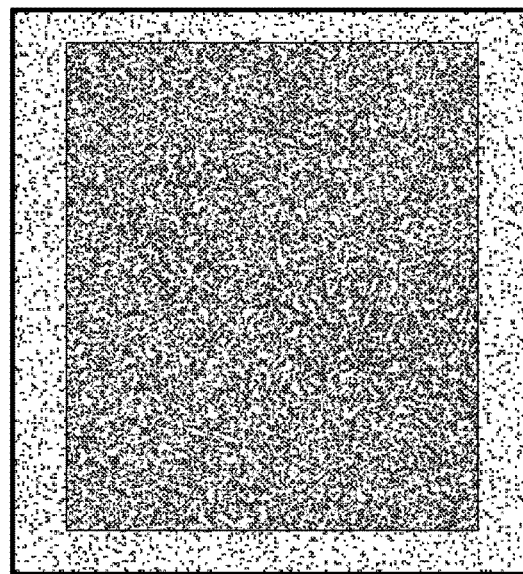
FIG. 4 is a schematic drawing of a plan view of an example of an individual optical component in accordance with the invention showing an example of the width dimension of the seal from the edge of the substrate to the optical material.

FIG. 3 schematically depicts an example of an exploded view of the substrates (shown as glass) and optical material (shown as a QD (quantum dot) layer) (that are not sealed) components of an embodiment of an individual optical component. The thickness of an hermetically sealed individual optical component can vary depending on the substrate thickness, thickness of the optical material, and whether other optional layers or features are included therein and/or thereon. A non-limiting example of a range of thicknesses for an individual optical component that can be useful in certain end-use applications (e.g., as a color conversion component with a semiconductor light emitting diode element) is about 0.2 mm to about 1 mm. As mentioned, depending on the particular intended end-use of the optical component, other thicknesses within or outside of this thickness range can be useful or desirable. The width of an individual optical component is also selected based on the intended end-use for the optical component. A non-limiting example of a range of a width and/or length dimension for an individual optical component that can be useful in certain end-use (e.g., as a color conversion component with a semiconductor light emitting diode element) is about 1 mm to about 100 mm. As mentioned, depending on the particular intended end-use of the optical component, other lengths and/or widths within or outside of this thickness range can be useful or desirable. In the depicted example shown in FIG. 4, a non-limiting example of the width of the hermetic seal from the edge of the substrate to the perimeter of the discrete region including the optical material is shown as being in a range from about 0.05 mm to about 1 mm. As mentioned, depending on the particular substrates, sealing materials, optical materials, and particular intended end-use of the optical component, other seal widths within or outside of this thickness range can be useful or desirable. An exemplary thickness for an optical material layer or film included in the optical component example depicted in FIG. 3 is in a range from about 50 microns to about 200 microns. As described below, in certain aspects the optical material can include red and green quantum dots when the optical component is to be used with a blue LED to make white light. Depending on the particular intended end-use of the optical component, an optical material can be included in an optical component at other thicknesses within and/or outside such range, and can include different luminescent material(s) based on the intended end-use for the optical component.

For example, the separating step can comprise cutting or dicing the assembly of multiple hermetically sealed optical components along the sealing areas between adjacent sealed discrete regions including optical material to form individual hermetically sealed optical components.

In aspects in which there is a gap between the sealing material that surrounds the perimeter of adjacent discrete regions, the separating step can comprise cutting the sealed assembly through the gap between adjacent discrete regions to provide individual sealed optical components.

In certain aspects in which the surface of the first substrate includes a recessed channel between adjacent discrete regions of the preselected arrangement, the separating step can comprise cutting the sealed assembly through the gap between adjacent discrete regions to provide individual sealed optical components.

In aspects in which two or more discrete regions in a preselected arrangement comprise recessed areas in the surface of the first substrate, the surface can further include recessed channel between the recessed areas, and the separating step can comprise cutting the sealed assembly through a recessed channel between adjacent recessed areas to provide individual sealed optical components.

In accordance with another aspect of the invention, there is provided an assembly of hermetically sealed planar optical component made by a method described herein.

In accordance with another aspect of the invention, there is provided hermetically sealed planar optical component made by a method described herein.

In accordance with another aspect of the invention, there is provided an hermetically sealed planar optical component comprising an optical material comprising a luminescent material sealed between planar glass substrates by an hermetic sealing material. Optionally, the optical component has a square or rectangular shape.

In accordance with another aspect of the invention, there is provided a light emitting device including a light emitting component and a color conversion component comprising an hermetically sealed planar optical component described herein in optical communication with light emitted by the light emitting component. Examples of preferred light emitting components include, but are not limited to, inorganic semiconductor light emitting diodes. In certain preferred aspects, there is a gap between the light emitting component and the optical component. Optionally, the optical component has a square or rectangular shape.

The present invention provides a method for making hermetically sealed optical components by a process that is scalable and can provide ease of manufacturing without high cost. Cost targets cannot be achieved making individual components involving separately handled and processed at the individual substrate size.

Additional information that may be useful in connection with the present disclosure and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods"; International Application No. PCT/US2010/32859 of Modi et al, filed 28 Apr. 2010 entitled "Optical Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2011/047284 of Sadasivan et al, filed 10 Aug. 2011 entitled "Quantum Dot Based Lighting"; International Application No. PCT/US2008/007901 of Linton et al, filed 25 Jun. 2008 entitled "Compositions And Methods Including Depositing Nanomaterial"; U.S. patent application Ser. No. 12/283,609 of Coe-Sullivan et al, filed 12 Sep. 2008 entitled "Compositions, Optical Component, System Including An Optical Component, Devices, And Other Products"; International Application No. PCT/US2008/10651 of Breen et al, filed 12 Sep. 2008 entitled "Functionalized Nanoparticles And Method"; U.S. Pat. No. 6,600,175 of Baretz, et al., issued Jul. 29, 2003, entitled "Solid State White Light Emitter And Display Using Same"; and U.S. Pat. No. 6,608,332 of Shimizu, et al., issued Aug. 19, 2003, entitled "Light Emitting Device and Display"; and U.S. patent application Ser. No. 13/762,354 of Nick, et al., filed 7 Feb. 2013, entitled "Methods of Making Components Including Quantum Dots, Methods, and Products"; each of the foregoing being hereby incorporated herein by reference in its entirety.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for making multiple hermetically sealed optical components, the method comprising:
   providing a first substrate including a surface including a patterned arrangement including two or more discrete regions including an optical material comprising a luminescent material, wherein each discrete region has a perimeter, wherein an hermetic sealing material is disposed on the surface of the substrate located around the perimeter of each of the discrete regions;
   providing a second substrate over the surface of the first substrate including the patterned arrangement of discrete regions and sealing material forming an assembly;
   sealing the sealing material between the first and second substrates to form an assembly of multiple hermetically sealed optical components; and
   separating the assembly of multiple hermetically sealed optical components into individual hermetically sealed optical components.

2. A method in accordance with claim 1 wherein the disposing step and sealing step are carried out in the absence of oxygen.

3. A method in accordance with claim 1 wherein the two or more discrete regions in a preselected arrangement comprise recessed areas in the surface of the first substrate.

4. A method in accordance with claim 3 wherein the sealing material is included on an area of the surface of the first substrate that is not recessed.

5. A method in accordance with claim 1 wherein there is a gap between the sealing material that surrounds the perimeter of adjacent discrete regions.

6. A method in accordance with claim 5 further comprising cutting the sealed assembly through the gap between adjacent discrete regions to provide individual sealed optical components.

7. A method in accordance with claim 1 wherein the surface of the first substrate includes a recessed channel between adjacent discrete regions of the preselected arrangement.

8. A method in accordance with claim 7 further comprising cutting the sealed assembly through the recessed channels between adjacent recessed areas to provide individual sealed optical components.

9. A method in accordance with claim 1 wherein an individual sealed optical component includes a major surface with at least one dimension in a range from about 1 mm to about 100 mm.

10. A method in accordance with claim 1 wherein an individual sealed optical component is sealed by a border seal of sealing material therebetween.

11. A method in accordance with claim 10 wherein the border seal has a width of about 0.02 to about 2 mm measured from the edge of the optical component.

12. A method in accordance with claim 1 wherein the luminescent material comprises inorganic semiconductor nanocrystals.

13. A method in accordance with claim 1 wherein the luminescent material comprises an inorganic phosphor.

14. A method in accordance with claim 1 wherein the optical material comprises a UV curable composition including the luminescent material.

15. A method in accordance with claim 1 wherein the individual optical components are hermetically sealed.

16. An hermetically sealed planar optical component made by a method in accordance with claim 1.

17. An hermetically sealed planar optical component in accordance with claim 16 wherein the luminescent material comprises semiconductor nanocrystals.

18. An hermetically sealed planar optical component in accordance with claim 16 wherein the luminescent material comprises an inorganic phosphor.

19. A light emitting device including a light emitting component and a color conversion component comprising an hermetically sealed planar optical component in accordance with claim 16 in optical communication with light emitted by the light emitting component.

20. A light emitting device in accordance with claim 19 wherein there is a gap between the light emitting component and the optical component.

* * * * *